United States Patent [19]
Hirama

[11] Patent Number: 5,567,575
[45] Date of Patent: Oct. 22, 1996

US005567575A

[54] METHOD OF MANUFACTURING SEMICONDUCTOR DEVICES

[75] Inventor: Masahide Hirama, Kanagawa, Japan

[73] Assignee: Sony Corporation, Tokyo, Japan

[21] Appl. No.: 443,563

[22] Filed: May 18, 1995

Related U.S. Application Data

[63] Continuation of Ser. No. 186,533, Jan. 26, 1994, abandoned.

[30] Foreign Application Priority Data

Jan. 26, 1993 [JP] Japan .................................. 5-029833

[51] Int. Cl.⁶ .............................. G03F 7/20; G03F 7/22
[52] U.S. Cl. .......................... 430/394; 430/312; 430/396
[58] Field of Search ................................... 430/311, 312, 430/394, 396, 397

[56] References Cited

U.S. PATENT DOCUMENTS

| | | | |
|---|---|---|---|
| 4,869,998 | 9/1989 | Eccles | 430/394 |
| 5,132,195 | 7/1992 | Pool | 430/394 |
| 5,302,491 | 4/1994 | Akylas | 430/394 |
| 5,308,741 | 5/1994 | Kemp | 430/396 |

*Primary Examiner*—Kathleen Duda

[57] ABSTRACT

When semiconductor devices having patterns with different repetition counts of repetition patterns are to be manufactured, a mask having a unit pattern for forming the repetition patterns is used, and photolithographic patterning processes in which the numbers of times of exposure are different from each other are used. For this reason, the number of masks can be reduced, and the masks can be formed at low cost. In addition, risk in manufacturing the semiconductor devices is decreased.

5 Claims, 2 Drawing Sheets

METHOD OF MANUFACTURING SEMICONDUCTOR DEVICES

This is a continuation of application Ser. No. 08/186,533, filed Jan. 26, 1994, now abandoned.

BACKGROUND OF THE INVENTION

1. Field of the Invention

The present invention relates to a method of manufacturing a semiconductor device having a repetition pattern obtained by repeating a unit pattern.

2. Description of the Prior Art

FIGS. 1 and 2 respectively show CCD linear sensors 11 and 12 of two types each having a start pixel portion A, repetition pixel portions B, and an end pixel portion C. However, the CCD linear sensors 11 and 12 have different repetition counts of the repetition pixel portions B. In this manner, when the CCD linear sensors 11 and 12 of two types having the repetition pixel portions B arranged at the same pitch but having different repetition counts are to be manufactured, exposure for lithography is conventionally performed using two sets of masks.

However, when a large number of masks must be used as described above, not only cost for forming the masks is increased, but also the masks must be tested. If this test is not performed, the CCD linear sensors 11 and 12 are manufactured at high risk.

In this specification, masks include a mask on which a pattern, having an actual size, for manufacturing a semiconductor element is drawn and a mask (reticle) on which a pattern having a size several to several tens times that of an actual size is drawn.

SUMMARY OF THE INVENTION

According to the first method of the present invention, semiconductor devices having patterns with different repetition counts of repetition patterns can be manufactured by using a mask having a unit pattern for forming the repetition patterns, and using photolithographic patterning processes in which the numbers of times of exposure are different from each other. For this reason, repetition patterns of a plurality of types having different repetition counts can be formed by a mask of one type having the unit pattern. Therefore, since the number of required masks is reduced, the masks can be formed at low cost. In addition, since new repetition patterns having a repetition count which is different from those of the other repetition patterns can be formed using the mask which is tested in advance, semiconductor devices can be manufactured at low risk.

According to the second method of the present invention, in the first method, the mask has the unit pattern and a pattern for forming a non-repetition pattern, and the exposure is performed using one mask. For this reason, when the mask is set in an exposure apparatus, the positions of the unit pattern and the non-repetition pattern are uniquely determined with respect to the exposure apparatus. Therefore, since the exposure can be performed without any positional alignment error between the exposure apparatus and the mask, a fine repetition pattern can be formed by the unit pattern.

According to the third method of the present invention, in the first method, the exposure is performed using a first mask having the unit pattern, and a second mask having a pattern for forming a non-repetition pattern. For this reason, in order to change either one of the unit pattern and the non-repetition pattern, only a corresponding mask need be changed. Therefore, since the number of patterns which must be reformed is small, masks can be formed at still lower cost.

According to the fourth method according to the present invention, in the first method, the repetition patterns include patterns for pixels, and the semiconductor devices are solid state image sensing elements. Since solid state image sensing elements having various pixel counts are manufactured in many cases, when these pixels are formed by changing the repetition counts of the repetition patterns, only a small number of masks are required for manufacturing solid state image sensing elements of a plurality of types having different pixel counts. For this reason, masks can be formed at low cost.

According to the fifth method of the present invention, the fourth method further includes the step of performing exposure using masks, having different patterns, for forming light-shielding films, and these light-shielding films are light-shielding films for forming optical black regions of the solid state image sensing elements. For this reason, in order to obtain an effective pixel count of one solid state image sensing element which is different from those of the other elements, only the pattern of the mask for forming the light-shielding films need be changed, and the patterns of the other masks need not be changed. Therefore, since the number of masks required for manufacturing solid state image sensing elements of a plurality of types having different effective pixel counts is small, masks can be formed at low cost.

The sixth method according to the present invention comprises: the step of providing a first mask having a first pattern and a second pattern for forming a repetition pattern; the first exposure step of exposing the first pattern using the mask; the second exposure step of exposing the second pattern n times using the mask; the third exposure step of exposing the first pattern using the mask; and the fourth exposure step of exposing the second pattern m times using the mask (n and m are different integers), and linear imaging devices having different pixel counts can be manufactured. Therefore, since the pixels of the linear imaging devices having different pixel counts can be formed by only a first mask, masks can be formed at low cost.

According to the seventh method according to the present invention, in the sixth method, exposure is performed using a second mask for forming a first light-shielding film to form a first linear imaging device having l effective pixels, and exposure is performed using a third mask for forming a second light-shielding film to form a second linear imaging device having k effective pixels. Therefore, since the pixels and light-shielding films of the linear imaging devices having different pixel counts and different effective pixel counts can be formed using only the first and second masks, masks can be formed at low cost.

According to the eighth method of the present invention, a mask having a unit pattern for forming patterns of repetition pixel portions is provided, exposure is performed n times using this mask to manufacture a first linear imaging device having a first repetition pixel portion, and exposure is performed m times using the mask to manufacture a second linear imaging device having a second repetition pixel portion. Therefore, since linear imaging devices having different pixel counts can be formed using only a mask of one type, masks can be formed at low cost.

DETAILED DESCRIPTION OF THE PREFERRED EMBODIMENTS

The first embodiment of the present invention applied to the manufacture of CCD linear sensors of two types having repetition pixel portions which are arranged at the same pitch but have different repetition counts will be described below with reference to FIGS. 1 to 3.

Figure 1:
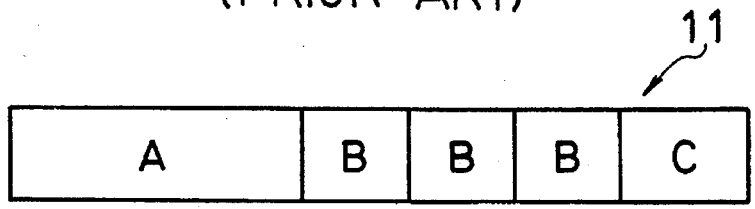
FIG. 1 is a plan view showing a CCD linear sensor having a small repetition count of repetition pixel portions of CCD linear sensors manufactured according to the first embodiment of the present invention.
Figure 2:
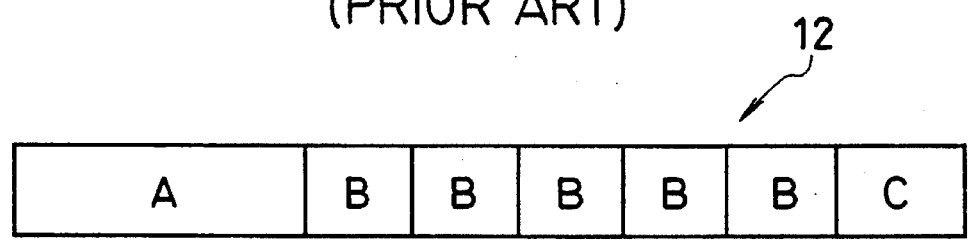
FIG. 2 is a plan view showing a CCD linear sensor having a large repetition count of repetition pixel portions of the CCD linear sensors manufactured according to the first embodiment of the present invention.
Figure 3:
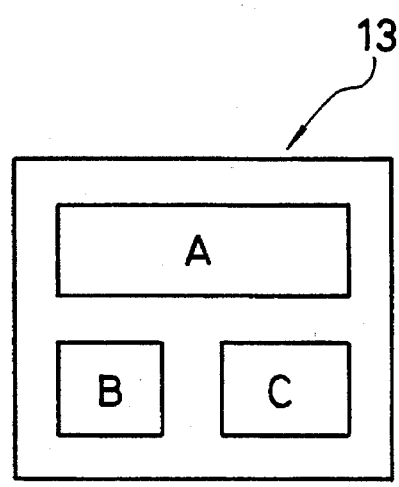
FIG. 3 is a plan view showing a reticle used in the first embodiment of the present invention.

Also in this embodiment, as already shown in FIGS. 1 and 2, CCD linear sensors 11 and 12 in which although a start pixel portion A, repetition pixel portions B, and an end pixel portion C are arranged, repetition counts of the repetition pixels B are different from each other are manufactured.

However, according to the first embodiment, when the CCD linear sensors 11 and 12 of two types are to be manufactured, unlike the prior art described above, two reticles are not used. Only one reticle 13 shown in FIG. 3 is used to perform exposure for lithography.

The patterns of a start pixel portion A, a repetition pixel portion B, and an end pixel portion C are independently formed in the reticle 13. The repetition pixel portion B includes a pattern corresponding to, e.g., 500 pixels.

According to the first embodiment, in the exposure process for lithography, the reticle 13 is set in a reducing projection exposure apparatus, and when the CCD linear sensor 11 is to be manufactured, the pattern of, e.g., the start pixel portion A, is exposed first. The pattern of the repetition pixel portion B is exposed three times, and then the pattern of the end pixel portion C is exposed. Note that the start pixel portion A and the repetition pixel portions B are exposed to be adjacent and continue to each other, the repetition pixel portions B are exposed to be adjacent and continue to each other and the repetition pixel portions B and the end pixel portion C are exposed to be adjacent and continue to each other as a matter of course.

When the CCD linear sensor 12 is to be formed, the pattern of, e.g., the start pixel portion A is exposed first. The pattern of the repetition pixel portion B is exposed five times, and then the pattern of the end pixel portion C is exposed. That is, when the CCD linear sensors 11 and 12 are to be formed, only the numbers of times of exposure of the pattern of the repetition pixel portion B are changed from each other in the CCD linear sensors 11 and 12, and the same reticle 13 is used.

Note that the CCD linear sensors 11 manufactured in the first embodiment have the same effective pixel count, and the CCD linear sensors 12 manufactured in the first embodiment have the same effective pixel count, as a matter of course. However, although the pattern of a light-shielding film normally covers only each pixel except for its photosensitive portion, when a mask having a pattern which also covers a predetermined portion of the photosensitive portion is used, CCD linear sensors having the same repetition count of the repetition pixel portions B but different effective pixel counts can be manufactured. Such a CCD linear sensor will be described later as the second embodiment in detail.

In the first embodiment described above, although all the patterns of the start pixel portion A, the repetition pixel portions B, and the end pixel portion C are formed in the same reticle 13, the patterns of the start pixel portion A and the end pixel portion C may be formed in a reticle which is different from the reticle in which the repetition pixel portions B are formed, or all the patterns may be formed in different reticles, respectively.

Figure 4:
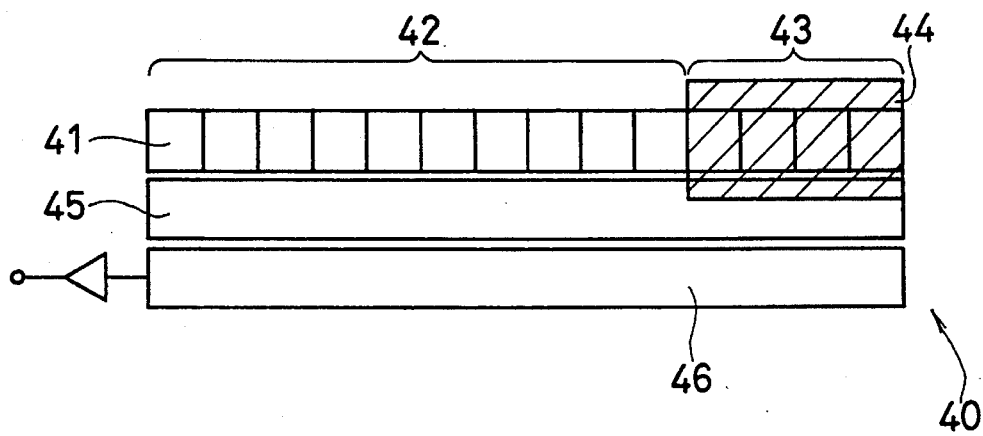
FIG. 4 is a plan view showing a CCD linear sensor having a large number of effective pixels of CCD linear sensors manufactured according to the second embodiment of the present invention.
Figure 5:
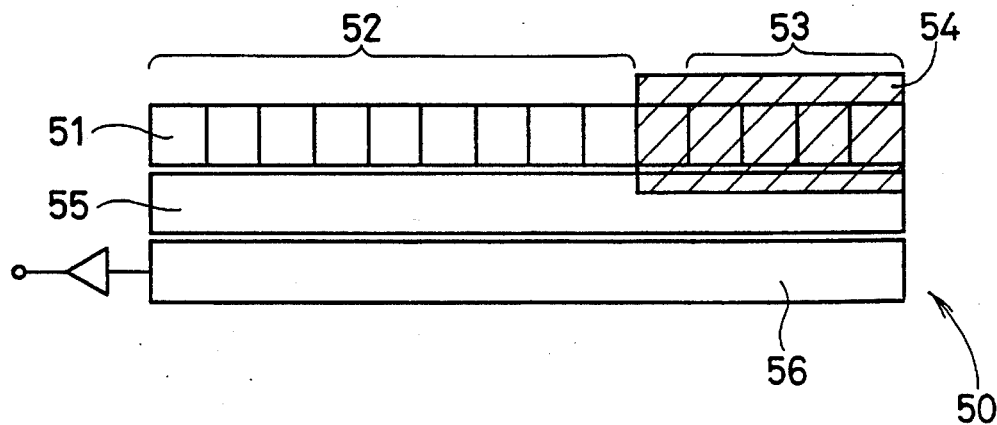
FIG. 5 is a plan view showing a CCD linear sensor having a small number of effective pixels of the CCD linear sensors manufactured according to the second embodiment of the present invention.

FIGS. 4 and 5 show CCD linear sensors according to the second embodiment of the present invention, respectively. As shown in FIG. 4, the sensor portion of a linear sensor 40 is divided into an effective pixel region 42 in which externally input incident light is photoelectrically converted by each photosensor 41 to obtain image information and an optical black region 43 for detecting the reference level of the image information, e.g., a black level (0 level). A transfer gate 45 and a CCD register 46 are arranged in correspondence with the sensor portion. The optical black region 43 is constituted by forming a first light-shielding film 44 on the sensor portion.

In contrast to this, a linear sensor 50 shown in FIG. 5 has an effective pixel region 52 having an effective pixel count different from that of the linear sensor 40. In FIG. 5, reference numerals 51, 53, 54, 55 and 56 denote a photosensor, an optical black region, a second light-shielding film, a transfer gate, and a CCD register. The first and second light-shielding films consist of a light-shielding material such as aluminum or tungsten.

In a method of manufacturing the linear sensors described above, when a mask (reticle) having a unit pattern for forming a pattern of a repetition pixel portion is used, and the number of times of exposure is changed, linear sensors of two types can be obtained. The pixel count of the repetition pixel portion in one of these linear sensors is an integer multiple of the pixel count of the repetition pixel portion in the other. In addition, when exposure is performed using different masks to form light-shielding films, linear sensors of two types can be manufactured. Although these linear sensors have the same pixel count in the repetition pixel portions, the difference between the effective pixel counts of these linear sensors is not an integer multiple of the pixel count of the repetition pixel portion.

Note that although the first and second embodiments are obtained by applying the present invention to the manufacture of a CCD linear sensor, the present invention can be applied to the manufacture of linear sensors except for a CCD linear sensor or to other semiconductor devices.

What is claimed is:

1. A method for manufacturing a semiconductor device having a CCD linear sensor defined thereon, said method comprising:

(a) providing a photosensitive semiconductor substrate on which a CCD linear sensor is to be defined, the CCD linear sensor including a first pattern portion including at least one non-repeating image unit and a continuous linearly adjacent second pattern portion, the second pattern portion including n number of repeating image units, wherein n is an integer;

(b) providing a reticle for imparting the first and second pattern portions on the substrate, the reticle including a first pattern imparting section and a repeatable unit imparting section;

(c) positioning the substrate in an exposure apparatus;

(d) positioning the reticle in the exposure apparatus adjacent the substrate so that the first pattern imparting section is disposed over a desired location on the substrate;

(e) exposing the first pattern imparting section to define the first pattern portion on the substrate;

(f) moving the reticle and substrate relative to each other and to the exposure apparatus, so that the repeatable unit imparting section is positioned to define a first image unit of the second pattern portion linearly adjacent the first pattern portion;

(g) exposing the repeatable unit imparting section to define a second image unit on the substrate;

(h) moving the reticle and substrate relative to each other and to the exposure apparatus so that the repeatable unit imparting section is positioned to define another second image unit linearly adjacent the previously defined second image unit;

(i) exposing the repeatable unit imparting section to define a next linearly adjacent second image unit on the substrate; and (j) thereafter, successively repeating steps (h) and (i) n-2 times until formation of the second pattern portion is complete.

2. A method as defined in claim 1, wherein said CCD linear sensor further includes a third pattern portion disposed continuous with and linearly adjacent the second pattern portion and the mask includes a third pattern imparting section; and the method further comprises:

(k) moving the reticle and substrate relative to each other and to the exposure apparatus so that the third pattern imparting section is positioned to define a third pattern portion linearly adjacent to a last image unit of the second pattern portion; and (l) exposing the third pattern imparting section to define the third pattern portion on the substrate.

3. A method as defined in claim 1, wherein each of the pattern portions define pixels.

4. A method as defined in claim 2, wherein said CCD linear sensor further includes a fourth pattern portion disposed continuous with and linearly adjacent to the third pattern portion, the fourth pattern portion including m number of repeating units, wherein m is an integer; and the method further comprising:

(m) moving the reticle and substrate relative to each other and to the exposure apparatus so that the repeatable unit imparting section is positioned to define a first image unit of the fourth pattern portion linearly adjacent the third pattern portion;

(n) exposing the repeatable unit imparting section to define the first image unit of the fourth pattern portion on the substrate;

(o) moving the reticle and substrate relative to each other and to the exposure apparatus, so that the repeatable unit imparting section is positioned to define another image unit linearly adjacent a previously defined image unit in said fourth pattern portion; and (p) thereafter, successively repeating steps (n) and (o) m-2 times until formation of the fourth pattern portion is complete.

5. A method as defined in claim 4, where the integers m and n are different.

* * * * *